(12) United States Patent
Campbell

(10) Patent No.: US 10,903,178 B1
(45) Date of Patent: Jan. 26, 2021

(54) ISOLATION NETWORK FOR MULTI-WAY POWER DIVIDER/COMBINERS

(71) Applicant: Qorvo US, Inc., Greensboro, NC (US)

(72) Inventor: Charles Forrest Campbell, Dallas, TX (US)

(73) Assignee: Qorvo US, Inc., Greensboro, NC (US)

(*) Notice: Subject to any disclaimer, the term of this patent is extended or adjusted under 35 U.S.C. 154(b) by 0 days.

(21) Appl. No.: 16/687,981

(22) Filed: Nov. 19, 2019

(51) Int. Cl.
| | |
|---|---|
| *H01L 23/66* | (2006.01) |
| *H01P 1/36* | (2006.01) |
| *H01L 23/528* | (2006.01) |
| *H01P 5/16* | (2006.01) |
| *H01L 23/522* | (2006.01) |

(52) U.S. Cl.
CPC ............ *H01L 23/66* (2013.01); *H01L 23/528* (2013.01); *H01L 23/5228* (2013.01); *H01P 1/36* (2013.01); *H01P 5/16* (2013.01); *H01L 2223/6627* (2013.01); *H01L 2223/6683* (2013.01)

(58) Field of Classification Search
CPC ... H01L 23/66; H01L 23/5228; H01L 23/528; H01L 2223/6627; H01L 2223/6683; H01P 1/36; H01P 5/16
See application file for complete search history.

(56) References Cited

U.S. PATENT DOCUMENTS

2005/0093532 A1* 5/2005 Adlerstein ............. G01R 21/02
324/76.14

OTHER PUBLICATIONS

Galani, Z., et al., "A Broadband Planar N-Way Combiner/Divider," IEEE MTT-S International Microwave Symposium Digest, San Diego, CA, Jun. 1977, pp. 499-502.
Saleh, Adel A. M., "Planar Electrically Symmetric n-Way Hybrid Power Dividers/Combiners," IEEE Transactions on Microwave Theory and Techniques, vol. MTT-28, No. 6, Jun. 1980, pp. 555-563.
Wilkinson, Ernest J., "An N-Way Hybrid Power Divider," IRE Transactions on Microwave Theory and Techniques, Jan. 1960, pp. 116-118.
Yau, W., et al., "A New N-way Broadband Planar Power Combiner/Divider,"IEEE MTT-S International Microwave Symposium Digest, Baltimore, MD, Jun. 1986, pp. 147-149.

* cited by examiner

*Primary Examiner* — Feifei Yeung Lopez
(74) *Attorney, Agent, or Firm* — Withrow & Terranova, P.L.L.C.

(57) ABSTRACT

An isolation network for multi-way power divider/combiners is provided. The isolation network provides a planar power divider/combiner according to an ideal design. Embodiments realize the isolation network using a series of isolation channels, each with an airbridge spanning over an isolation resistor and a common resistor bus connecting the isolation resistors together. In this manner, a symmetric multi-way power divider/combiner can be provided with superior performance to conventional approaches, including high isolation and low insertion loss.

20 Claims, 12 Drawing Sheets

US 10,903,178 B1

ISOLATION NETWORK FOR MULTI-WAY POWER DIVIDER/COMBINERS

FIELD OF THE DISCLOSURE

The present disclosure relates to power dividers, power combiners, and power divider/combiners for integrated circuits and alumina thin film circuits.

BACKGROUND

Power dividers and combiners, including microwave power dividers, power combiners, and divider/combiners, are used extensively in radio frequency (RF) and microwave communications systems. Equal and unequal power split designs are well established for $2^N$ way division, i.e. 2-way, 4-way, 8-way, etc. These types of power dividers are generally combinations of ideal 2-way Wilkinson-type designs, as illustrated in FIGS. 1A and 1B.

FIG. 1A is a schematic diagram of a Wilkinson-type ideal 2-way power divider 10. The ideal 2-way power divider 10 has a common input/output (I/O) port 12 (e.g., an input when splitting power), a first split I/O port 14, and a second split I/O port 16. An impedance transformer 18 is connected between the common I/O port 12 and the first split I/O port 14, and another impedance transformer 18 is connected between the common I/O port 12 and the second split I/O port 16. An isolation resistor R1 is coupled between the first split I/O port 14 and the second split I/O port 16. The ideal 2-way power divider 10 will in theory have perfect performance at a single frequency: an equal power split and infinite isolation between the first split I/O port 14 and the second split I/O port 16.

FIG. 1B is a schematic diagram of a 4-way power divider 20 constructed from the ideal 2-way power dividers 10 of FIG. 1A. Three ideal 2-way power dividers 10 are connected in two cascaded stages between the common I/O port 12, the first split I/O port 14, the second split I/O port 16, a third split I/O port 22, and a fourth split I/O port 24. Unfortunately, to directly apply the Wilkinson approach for a single stage N>2 power split (including power splits of N>2 that are not $2^N$) requires a $3^{rd}$ dimension to properly realize the isolation resistors.

FIG. 2 is a schematic diagram of a Wilkinson-type ideal single stage 4-way power divider 26. Such a multi-way power divider requires a $3^{rd}$ dimension, which is typically not realizable for planar circuits. Therefore existing direct realizations of planar designs for 3-way, 4-way, 5-way, etc. power division ratios are approximations of the 3-dimensional Wilkinson approach, such as illustrated in FIGS. 3A-3C.

FIG. 3A is a schematic diagram of a conventional asymmetric 3-way power divider 28 suitable for a planar design. FIG. 3B is a schematic diagram of a conventional asymmetric 4-way power divider 30 suitable for a planar design. FIG. 3C is a schematic diagram of a conventional asymmetric 5-way power divider 32 (with a fifth split I/O port 34) suitable for a planar design. FIGS. 3A-3C illustrate a common approach which approximates an ideal multi-way power divider by removing the isolation resistor R1 which requires the $3^{rd}$ dimension (e.g., the isolation resistor R1 connecting the first split I/O port 14 to the fourth split I/O port 24 in FIG. 2). The circuits of FIGS. 3A-3C are planar but inherently asymmetric, which results in degraded match, isolation and bandwidth.

Different resistance values may be used for isolation resistors R1, R2, R3, R4 in order to mitigate the asymmetry of these designs. Additionally, due to this inherent asymmetry most commercially available designs are $2^N$ power splits using multiple 2-way power dividers of the form shown in FIG. 1B. While some asymmetric 3-way power dividers 28 (as shown in FIG. 3A) are commercially available, 5-way, 6-way, 7-way, etc. versions are generally unavailable.

SUMMARY

An isolation network for multi-way power divider/combiners is provided. The isolation network provides a planar power divider/combiner according to an ideal design. Embodiments realize the isolation network using a series of isolation channels, each with an airbridge spanning over an isolation resistor and a common resistor bus connecting the isolation resistors together. In this manner, a symmetric multi-way power divider/combiner can be provided with superior performance to conventional approaches, including high isolation and low insertion loss.

An exemplary embodiment provides an isolation network for a multi-way power divider/combiner. The isolation network includes a substrate and a plurality of isolation channels. Each isolation channel includes a common side port disposed on the substrate, a split side port disposed on the substrate, and an airbridge coupled between the common side port and the split side port and suspended over the substrate. The isolation network further includes a plurality of isolation resistors, each being disposed on the substrate below a respective airbridge and having a first end coupled to a respective isolation channel of the plurality of isolation channels. The isolation network further includes a common resistor bus coupled to a second end of each of the plurality of isolation resistors.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
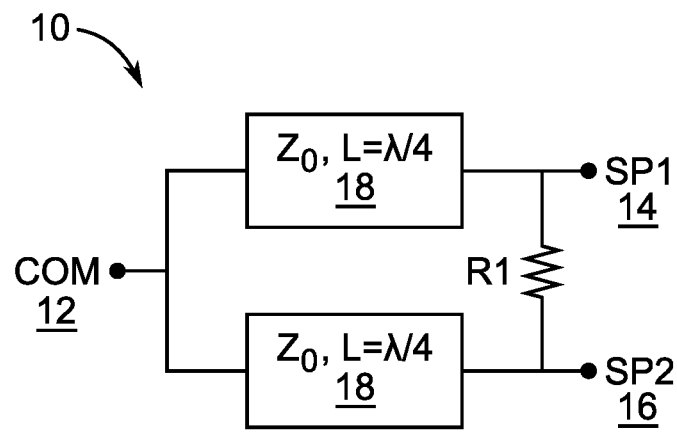
FIG. 1A is a schematic diagram of a Wilkinson-type ideal 2-way power divider.
Figure 1B:
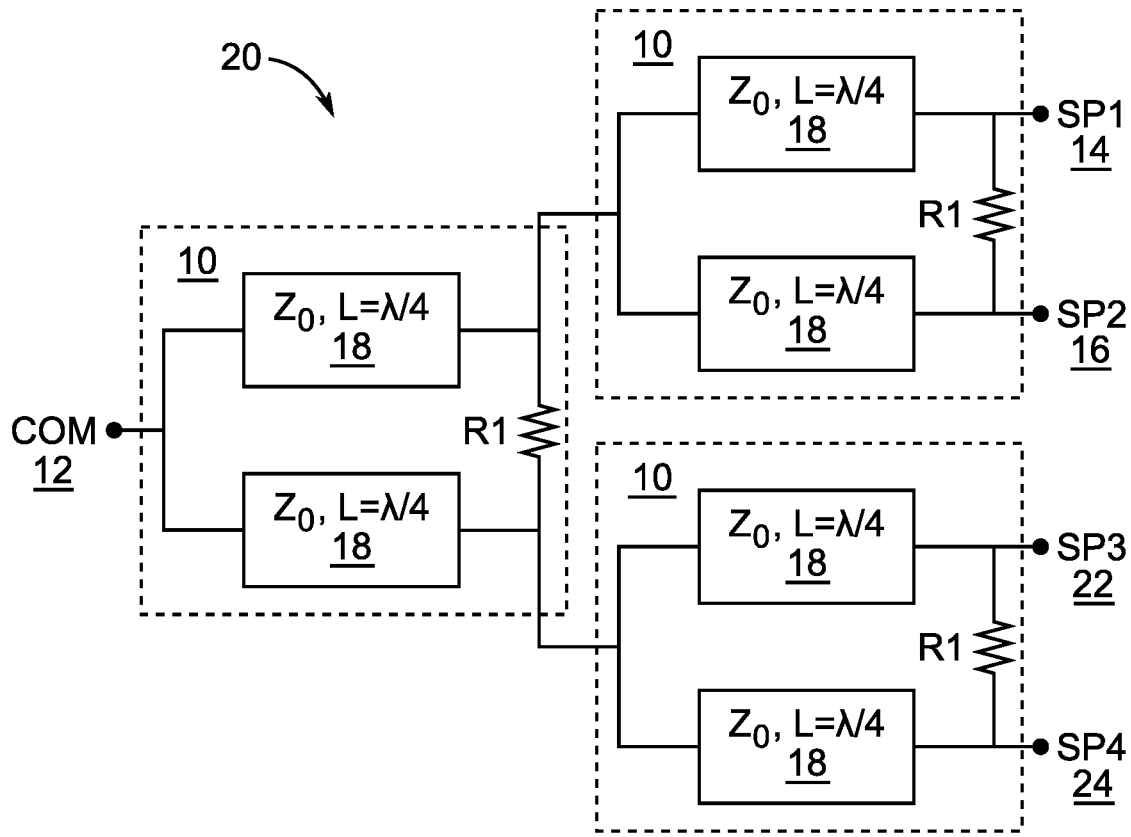
FIG. 1B is a schematic diagram of a 4-way power divider constructed from the ideal 2-way power dividers of FIG. 1A.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

An isolation network for multi-way power divider/combiners is provided. The isolation network provides a planar power divider/combiner according to an ideal design. Embodiments realize the isolation network using a series of isolation channels, each with an airbridge spanning over an isolation resistor and a common resistor bus connecting the isolation resistors together. In this manner, a symmetric multi-way power divider/combiner can be provided with superior performance to conventional approaches, including high isolation and low insertion loss.

Figure 2:
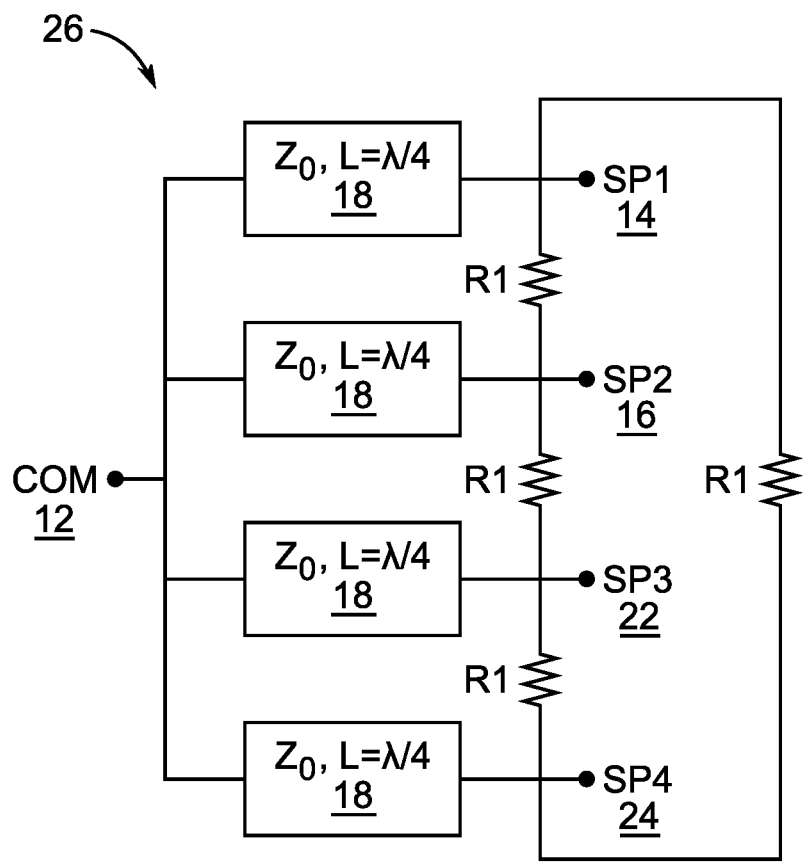
FIG. 2 is a schematic diagram of a Wilkinson-type ideal single stage 4-way power divider
Figure 4:
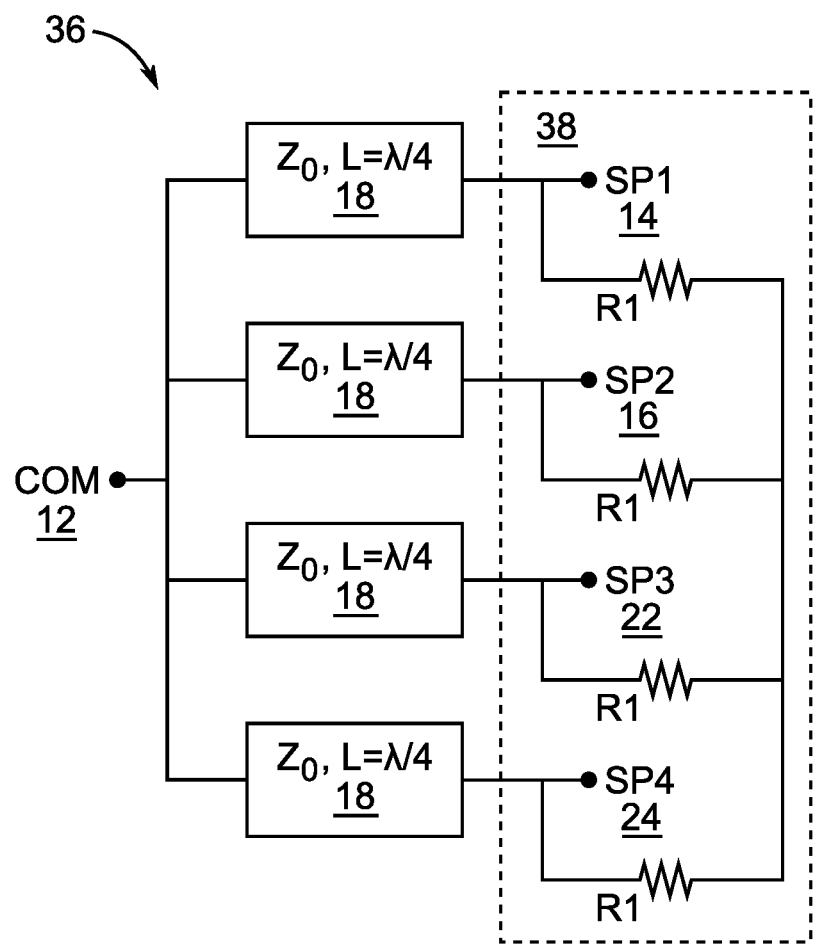
FIG. 4 is a schematic diagram of a multi-way power divider/combiner according to embodiments disclosed herein.

FIG. 4 is a schematic diagram of a multi-way power divider/combiner 36 according to embodiments disclosed herein. The multi-way power divider/combiner 36 is illustrated as a 4-way power divider/combiner which is equivalent to the ideal single stage 4-way power divider 26 of FIG. 2. Embodiments described herein provide an isolation network 38 for the multi-way power divider/combiner 36 to realize an ideal planar Wilkinson-type power divider/combiner with high isolation and low insertion loss.

In an exemplary aspect, the isolation network 38 and the multi-way power divider/combiner 36 are compatible with planar circuit technologies that incorporate airbridges, such as monolithic microwave integrated circuit (MMIC) process technology (e.g., being formed directly on a MMIC wafer), alumina thin film circuits, and so on. It should be understood that the multi-way power divider/combiner 36 is illustrated as a 4-way power divider/combiner with a common input/output (I/O) port 12, a first split I/O port 14, a second split I/O port 16, a third split I/O port 22, and a fourth split I/O port 24 for illustrative purposes. Embodiments provide an isolation network 38 for a symmetric N-way power divider/combiner for any natural number N in a single stage.

The isolation network 38 provides isolation between each of the first split I/O port 14, the second split I/O port 16, the third split I/O port 22, and the fourth split I/O port 24 such that the multi-way power divider/combiner 36 can be operated as both a power divider (which generally does not require such isolation) and as a power combiner (which generally requires isolation to prevent feedback between any pair of the split I/O ports). A plurality of impedance transformers 18 is provided between the isolation network 38 and the common I/O port 12. Each impedance transformer 18 can be a quarter wave transformer for matching. In an exemplary aspect, each impedance transformer 18 can be formed as a radio frequency (RF) transmission line providing a delay of one quarter of a desired RF signal wavelength. As illustrated in FIG. 4, a common side conductor can be used to connect the impedance transformers 18 together at an opposite end from the isolation network 38.

Figure 5A:
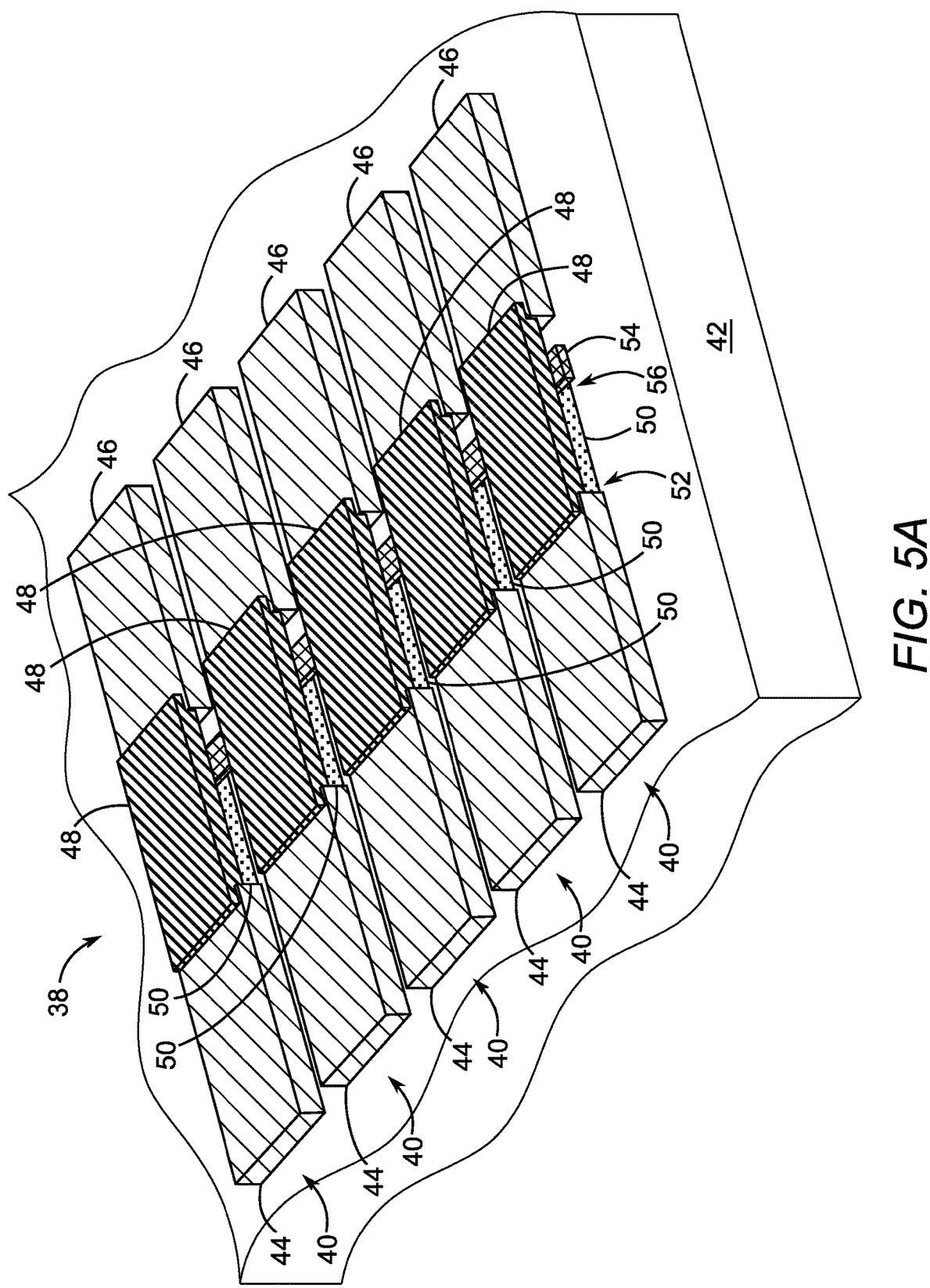
FIG. 5A is a top view of an exemplary isolation network for the multi-way power divider/combiner of FIG. 4.
Figure 5B:
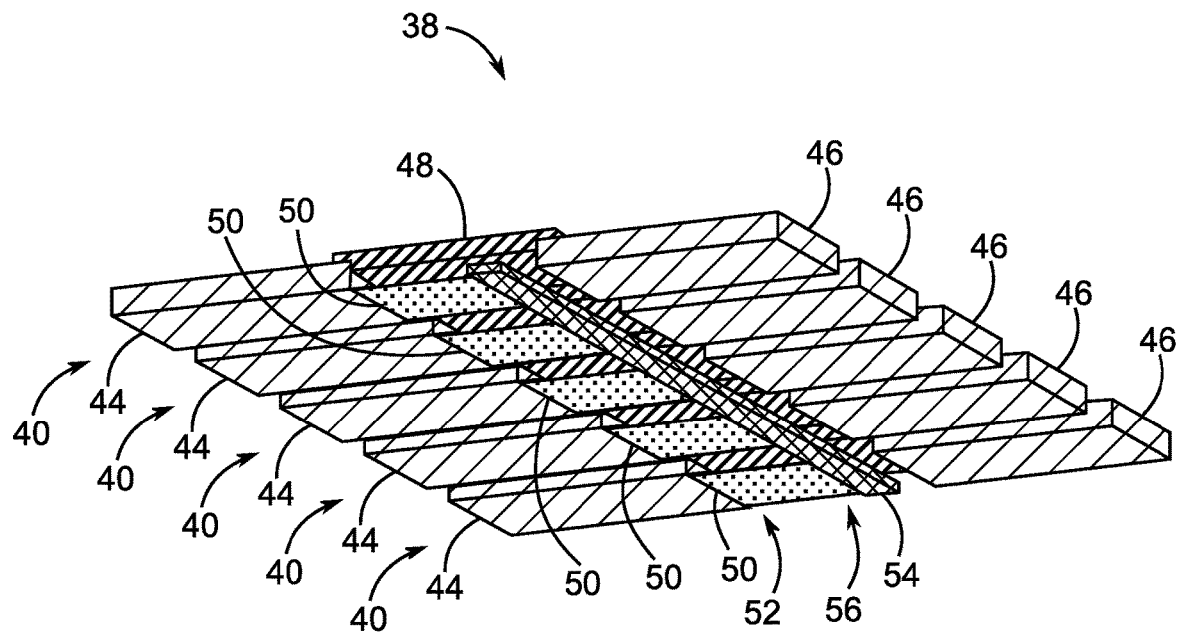
FIG. 5B is a bottom view of the isolation network of FIG. 5A.
Figure 5C:
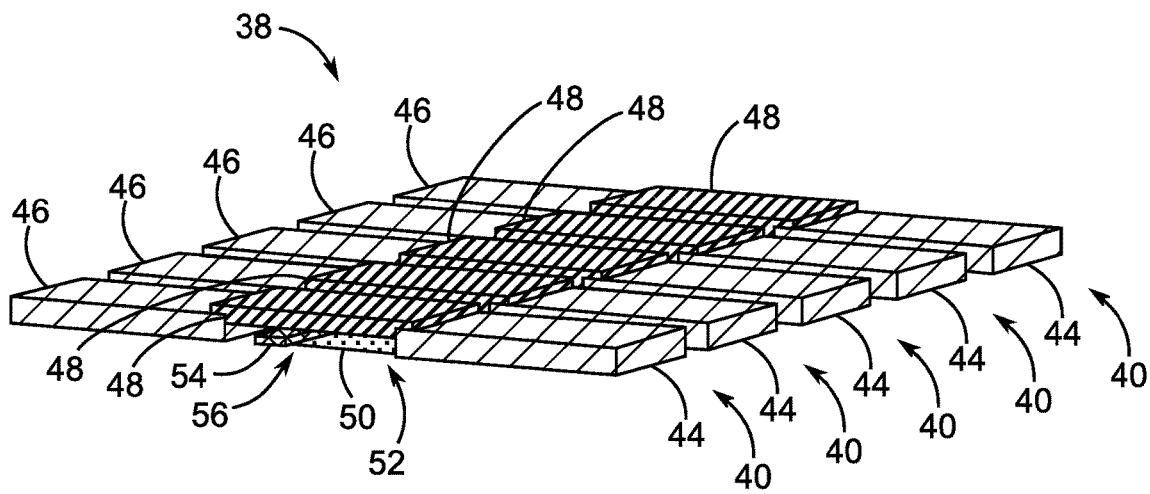
FIG. 5C is a rotated view of the isolation network of FIG. 5A.

FIG. 5A is an isometric view of an exemplary isolation network 38 for the multi-way power divider/combiner 36 of FIG. 4. FIG. 5B is a bottom view of the isolation network of FIG. 5A. FIG. 5C is a rotated view of the isolation network 38 of FIG. 5A. With reference to FIGS. 5A-5C, the isolation network 38 includes two or more isolation channels 40 disposed over a substrate 42. The substrate 42 can be a common substrate with the multi-way power divider/combiner 36 of FIG. 4, such as a MMIC wafer. The isolation network 38 is illustrated with 5 isolation channels 40 for a 5-way power divider/combiner, but it should be understood that embodiments of the isolation network 38 can include any natural number N isolation channels 40 for an N-way power divider/combiner.

Each of the isolation channels 40 includes a common side port 44 (which may couple to the common I/O port 12 of FIG. 4 via a corresponding impedance transformer 18) and a split side port 46 (which may be or couple to a corresponding split I/O port, such as the first split I/O port 14, the second split I/O port 16, etc. of FIG. 4). Each isolation channel 40 also includes an airbridge 48 suspended over the substrate 42 and spanning between the common side port 44 and the split side port 46.

An isolation resistor 50 is provided for each isolation channel 40. Each isolation resistor 50 is disposed on the substrate 42 and below a respective airbridge 48. A first end 52 of each isolation resistor 50 is coupled to a corresponding isolation channel 40. A common resistor bus 54 couples a second end 56 of each isolation resistor 50 together. In this manner, the isolation resistors 50 connect each of the isolation channels 40 to a joint node with the common resistor bus 54. The airbridges 48 span over the isolation resistors 50 and the common resistor bus 54 to allow for the joint node for the isolation resistors 50 while connecting the common side ports 44 to the split side ports 46. This completes the isolation network 38 circuit illustrated in FIG. 4 in a planar integrated circuit package.

Each of the isolation channels 40 is generally positioned adjacent and parallel to another isolation channel 40, though this may be different in other embodiments. The isolation channels 40 can be formed using appropriate techniques, such as planar MMIC deposition techniques. The isolation resistor 50 for each isolation channel 40 can be formed from an appropriate resistive material, such as a bulk or film semiconductor material (e.g., based on the material used for the substrate 42 and/or active layers epitaxially or otherwise formed over the substrate 42). The common side ports 44, split side ports 46, airbridges 48, and common resistor bus 54 can be formed with a metal or other conductive material, such as copper, gold, silver, aluminum, tin, etc. These are illustrated as rectangular in form, but may take on other shapes in order to optimize circuit performance.

In the embodiment of FIGS. 5A-5C, the first end 52 of each of the isolation resistors 50 is coupled to the common side port 44 of the respective isolation channel 40. This can be done through direct contact between each isolation resistor 50 and the respective common side port 44. In other embodiments, the isolation resistors 50 can be connected to the isolation channels 40 in another manner.

Figure 6:
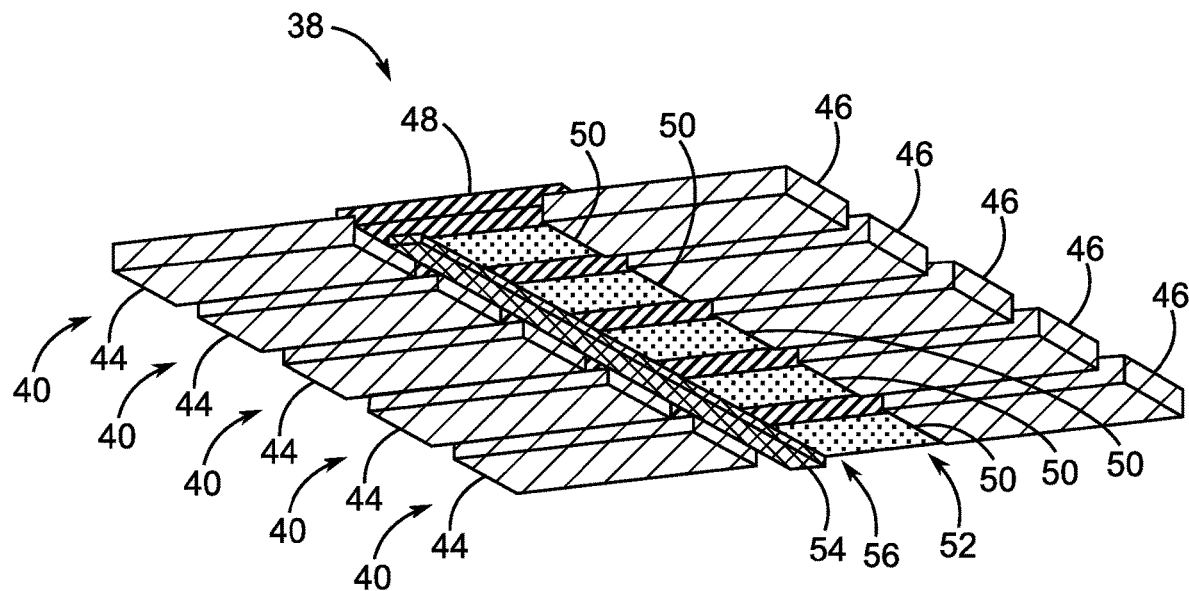
FIG. 6 is a bottom view of another exemplary isolation network for the multi-way power divider/combiner of FIG. 4.

FIG. 6 is a bottom view of another exemplary isolation network 38 for the multi-way power divider/combiner 36 of FIG. 4. The isolation network 38 is similar to the embodiment illustrated in FIGS. 5A-5C, with the first end 52 of each isolation resistor 50 being in direct contact with the split side port 46 of the respective isolation channel 40.

Figure 7:
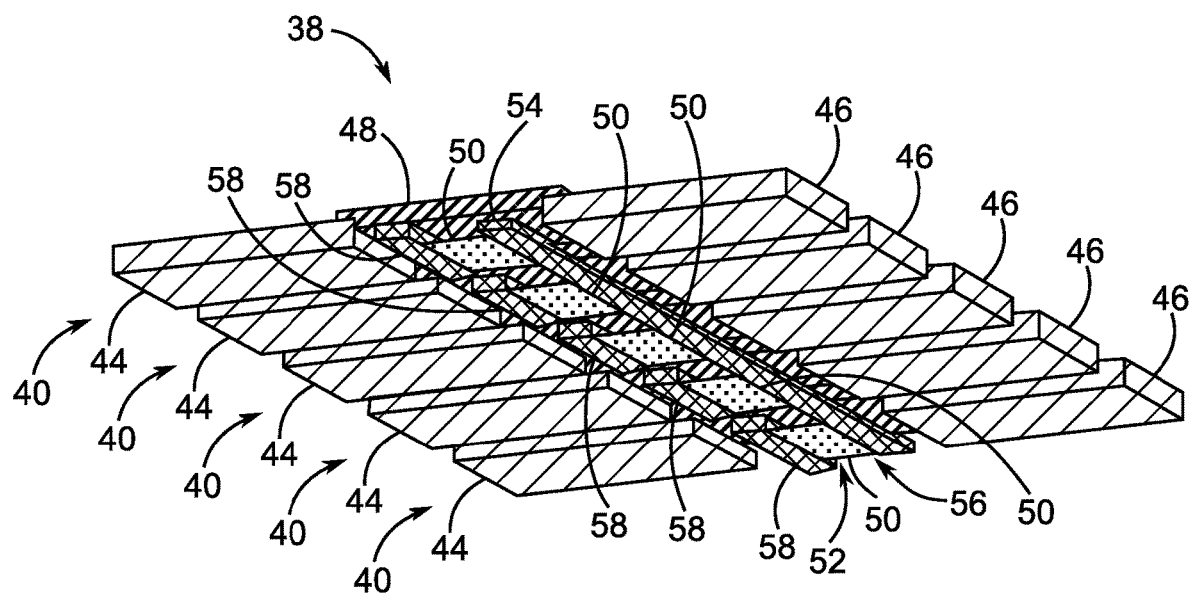
FIG. 7 is a bottom view of another exemplary isolation network for the multi-way power divider/combiner of FIG. 4.

FIG. 7 is a bottom view of another exemplary isolation network 38 for the multi-way power divider/combiner 36 of FIG. 4. The isolation network 38 is similar to the embodiment illustrated in FIGS. 5A-5C, with the first end 52 of each isolation resistor 50 connected with the airbridge 48 of the respective isolation channel 40 through a respective connector 58.

Figure 8A:
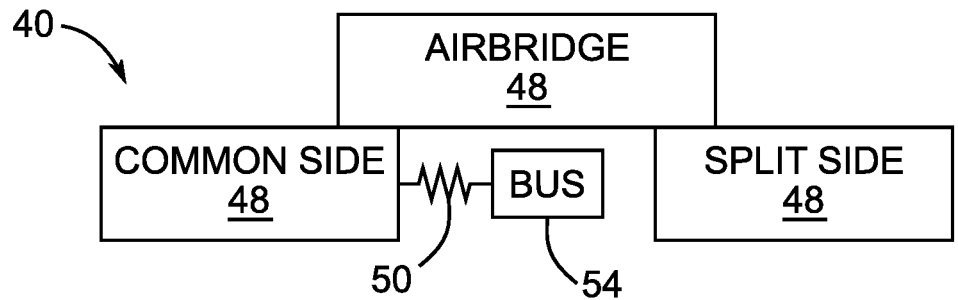
FIGS. 8A-8E illustrate various electrically equivalent approaches for connecting an isolation resistor to an isolation channel.
Figure 8B:
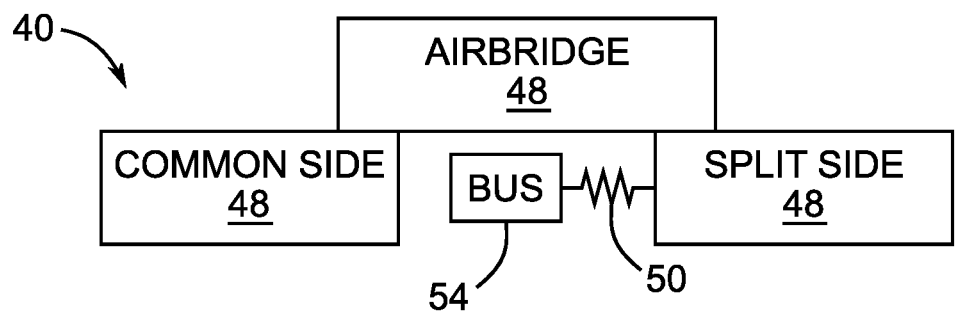
Figure 8C:
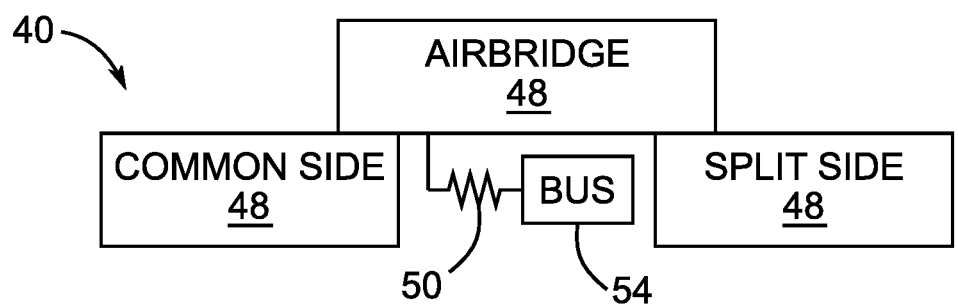

FIGS. 8A-8E illustrate various electrically equivalent approaches for connecting the isolation resistor 50 to the isolation channel 40. FIG. 8A is a schematic diagram illustrating connection of the isolation resistor 50 to the common side port 44, as in FIGS. 5A-5C. FIG. 8B is a schematic diagram illustrating connection of the isolation resistor 50 to the split side port 46, as in FIG. 6. FIG. 8C is a schematic diagram illustrating connection of the isolation resistor 50 to the airbridge 48, as in FIG. 7.

Figure 8D:
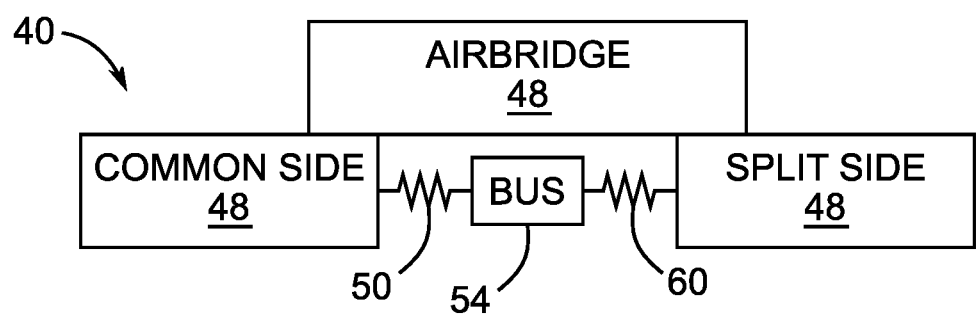
Figure 8E:
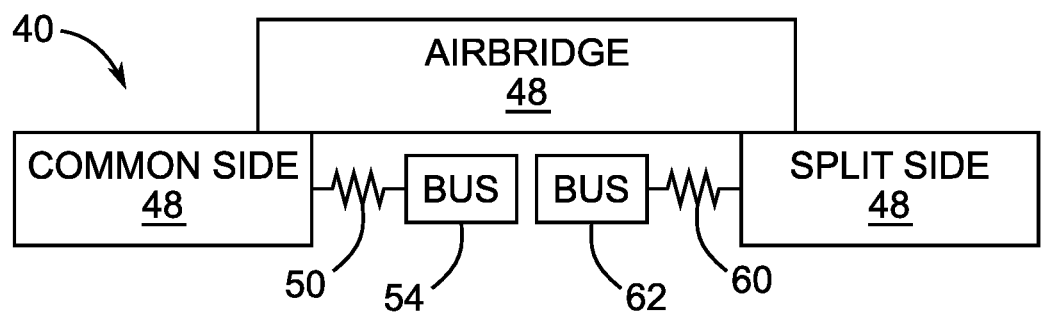

FIG. 8D is a schematic diagram illustrating a first isolation resistor 50 connected between the common side port 44 and the common resistor bus 54, as well as a second isolation resistor 60 connected between the split side port 46 and the common resistor bus 54. FIG. 8E is a schematic diagram illustrating the first isolation resistor 50 connected between the common side port 44 and a first common resistor bus 54, as well as the second isolation resistor 60 connected between the split side port 46 and a second common resistor bus 62. Electrically, the first isolation resistor 50 and the second isolation resistor 60 of FIGS. 8D and 8E are connected in parallel and combine into a single resistance value for each isolation channel 40.

Figure 9A:
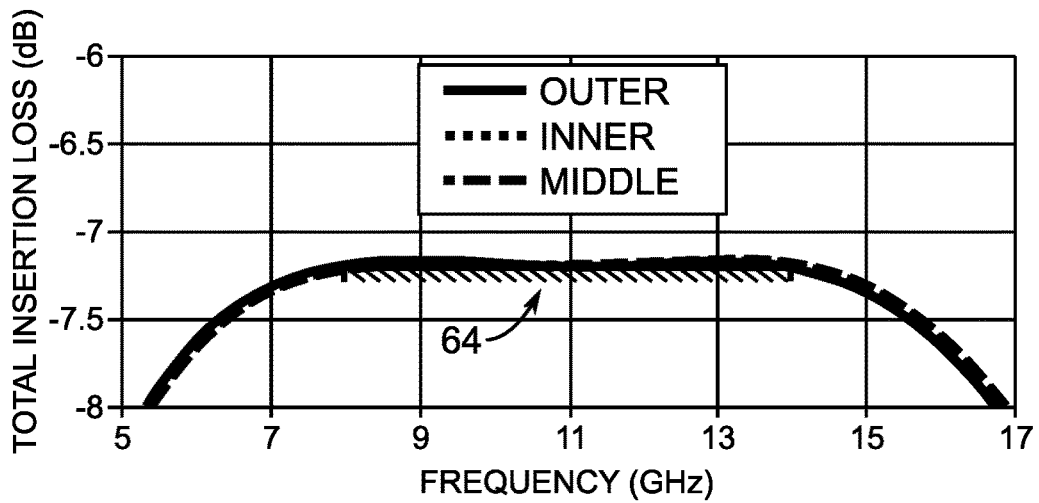
FIG. 9A is a graphical representation of total insertion loss for a 5-way power divider/combiner according to the design of FIG. 4 with the isolation network of FIG. 5A.

FIG. 9A is a graphical representation of total insertion loss for a 5-way power divider/combiner according to the design of FIG. 4 with the isolation network 38 of FIG. 5A. Three traces are shown due to the isolation network 38 being mirrored across a middle isolation channel 40, such that performance is identical for each of two outer isolation channels 40 and for each of two inner isolation channels 40. The simulated insertion loss is about 0.25 decibels (dB) (6.99 dB is due to the power split) over an 8-14 gigahertz (GHz) frequency band (indicated by item 64).

Figure 9B:
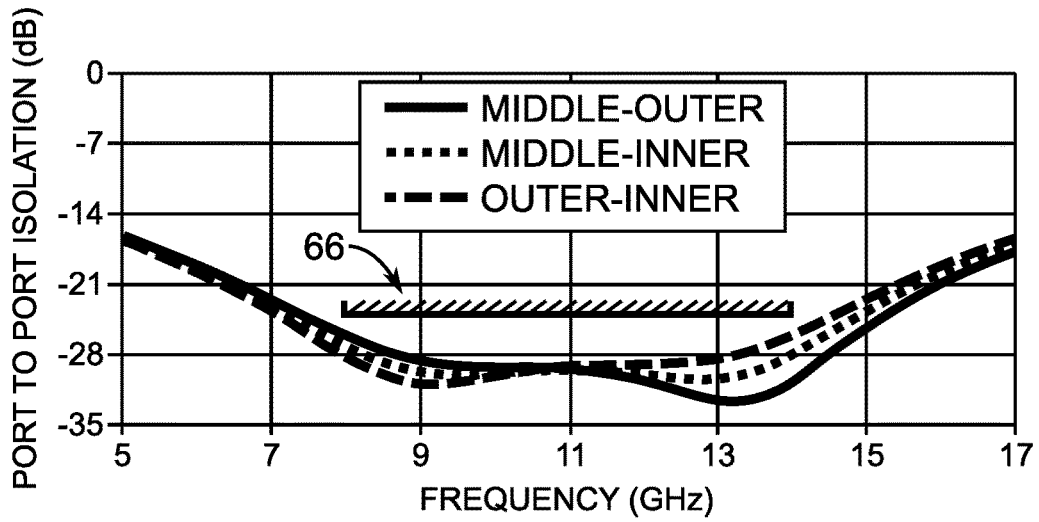
FIG. 9B is a graphical representation of port to port isolation for the 5-way power divider/combiner of FIG. 9A.

FIG. 9B is a graphical representation of port to port isolation for the 5-way power divider/combiner of FIG. 9A. The isolation is 24 dB typically across the ports over the 8-14 GHz frequency band (indicated by item 66).

Figure 9C:
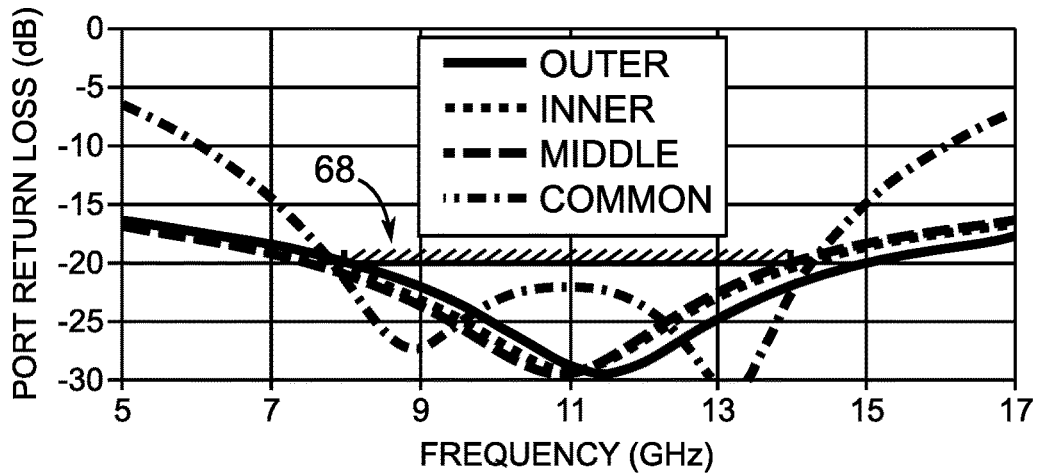
FIG. 9C is a graphical representation of return loss for the 5-way power divider/combiner of FIG. 9A.

FIG. 9C is a graphical representation of return loss for the 5-way power divider/combiner of FIG. 9A. The return loss is better than 20 dB over the 8-14 GHz frequency band (indicated by item 68). It should further be noted that the frequency response is similar for the 5 channels of the power divider/combiner, indicating a high level of symmetry in the network with the isolation network 38.

Figure 3A:
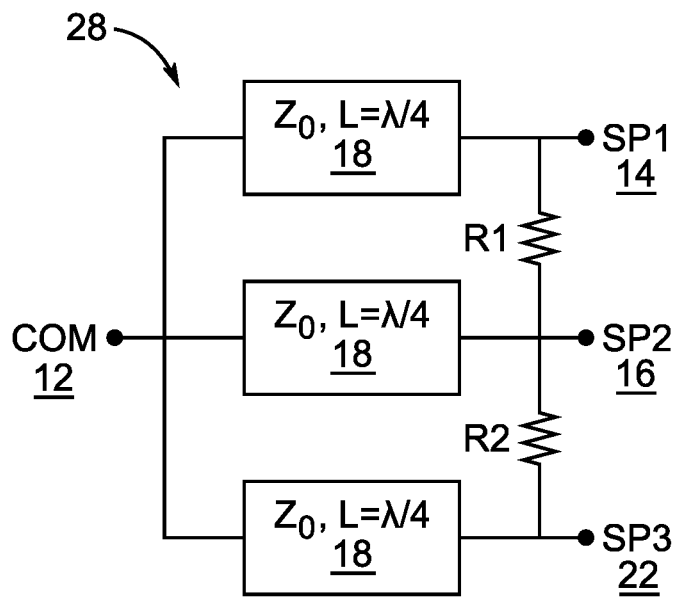
FIG. 3A is a schematic diagram of a conventional asymmetric 3-way power divider suitable for a planar design.
Figure 3B:
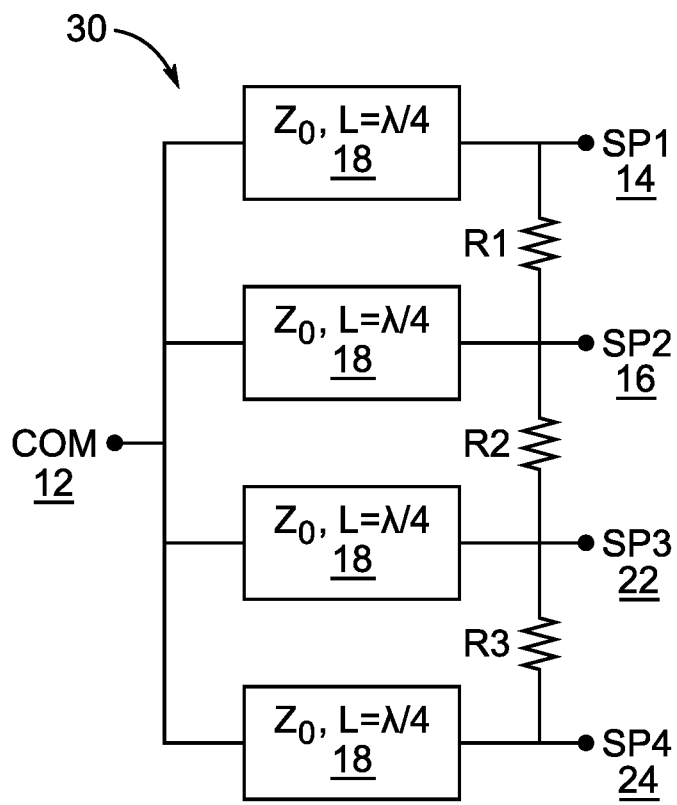
FIG. 3B is a schematic diagram of a conventional asymmetric 4-way power divider suitable for a planar design.
Figure 3C:
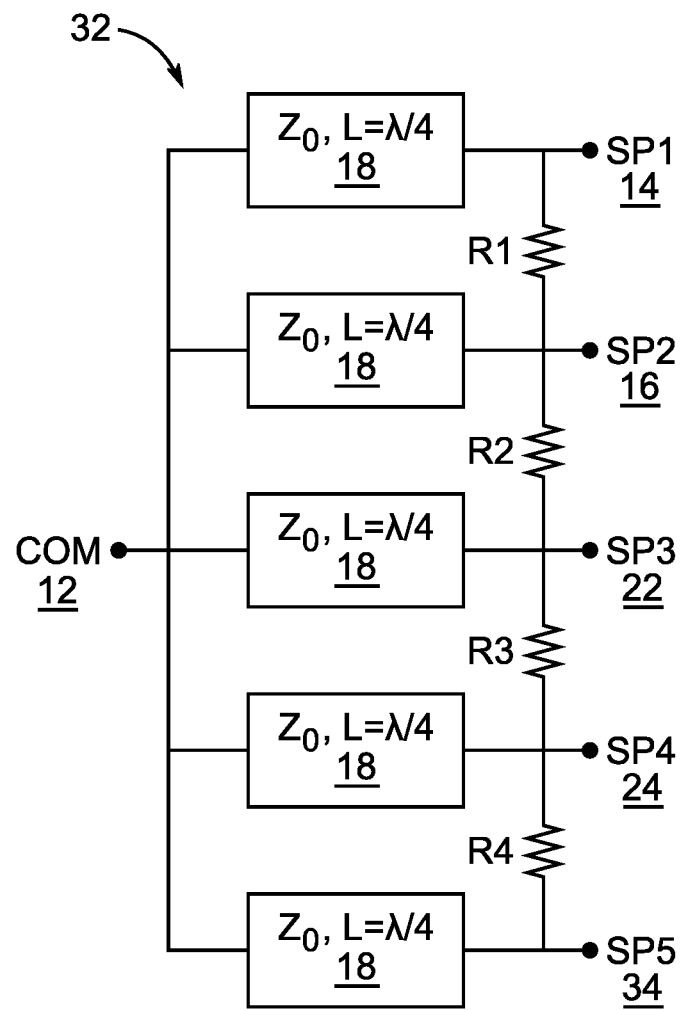
FIG. 3C is a schematic diagram of a conventional asymmetric 5-way power divider suitable for a planar design.
Figure 10A:
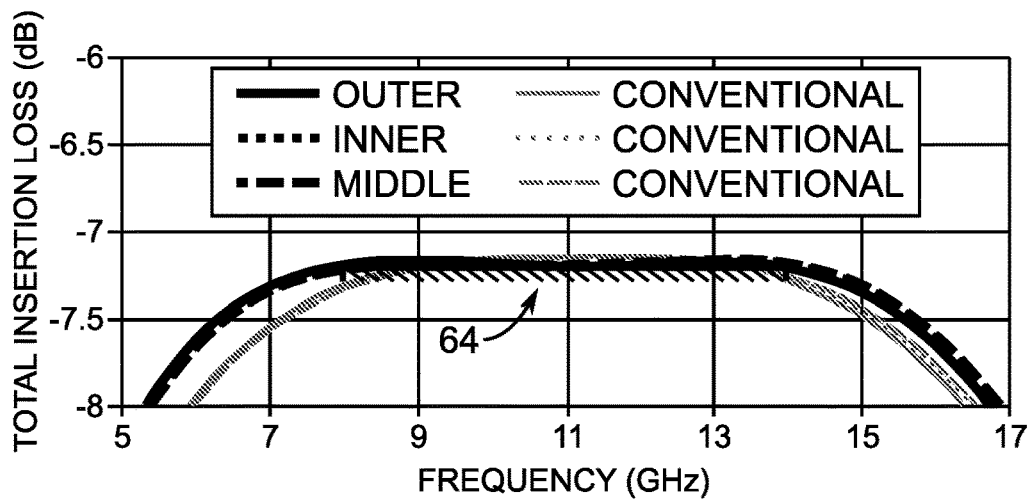
FIG. 10A is a graphical representation comparing total insertion loss for the 5-way power divider/combiner of FIG. 9A with the conventional asymmetric 5-way power divider of FIG. 3C.
Figure 10B:
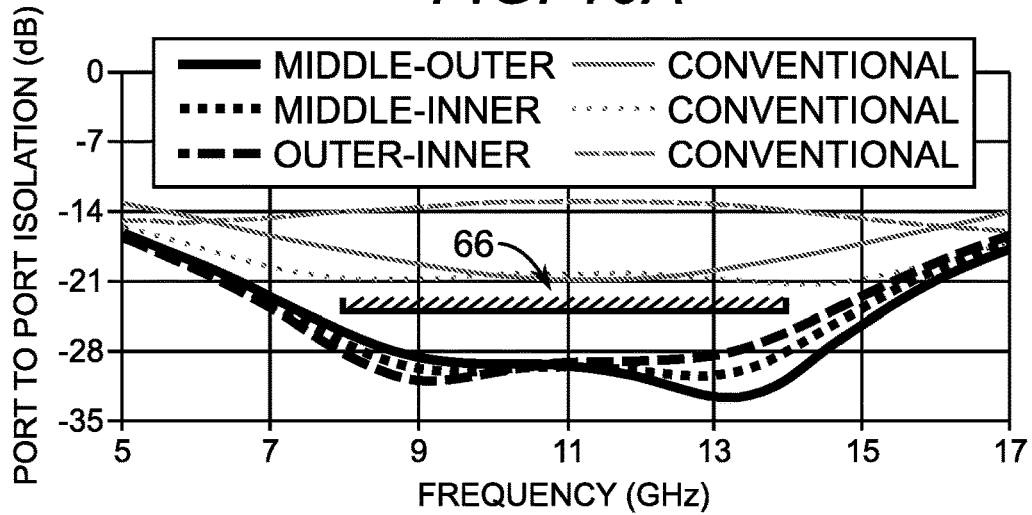
FIG. 10B is a graphical representation comparing port to port isolation for the 5-way power divider/combiner of FIG. 9A with the conventional asymmetric 5-way power divider of FIG. 3C.
Figure 10C:
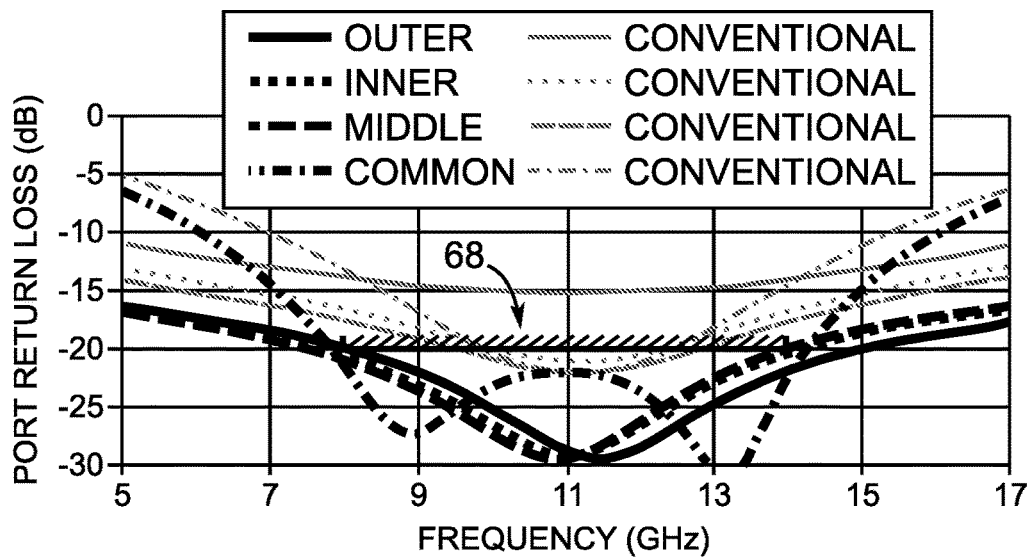
FIG. 10C is a graphical representation comparing return loss for the 5-way power divider/combiner of FIG. 9A with the conventional asymmetric 5-way power divider of FIG. 3C.

FIG. 10A is a graphical representation comparing total insertion loss for the 5-way power divider/combiner of FIG. 9A with the conventional asymmetric 5-way power divider of FIG. 3C. FIG. 10B is a graphical representation comparing port to port isolation for the 5-way power divider/combiner of FIG. 9A with the conventional asymmetric 5-way power divider of FIG. 3C. FIG. 10C is a graphical representation comparing return loss for the 5-way power divider/combiner of FIG. 9A with the conventional asymmetric 5-way power divider of FIG. 3C.

The performance results of the conventional asymmetric 5-way power divider of FIG. 3C are plotted as thinner, lighter traces in FIGS. 10A-10C. Comparing these against the 5-way power divider/combiner of FIG. 9A reveals that the isolation network 38 exhibits superior performance characteristics to the conventional circuit topology. The fractional bandwidth for the new design is about 50% larger than what was achieved with the conventional approach. There are even larger improvements for the isolation and return loss with the new circuit topology.

The conventional design is inherently non-symmetric due to the removal of an isolation resistor, which is readily apparent from the isolation plot of FIG. 10B and the return loss plot of FIG. 10C. The worst case isolation degrades nearly 15 dB midband over that of the 5-way power divider/combiner of FIG. 9A with the isolation network 38 disclosed herein. Similar differences are also observed in the return loss between the two circuit topologies.

Those skilled in the art will recognize improvements and modifications to the preferred embodiments of the present disclosure. All such improvements and modifications are considered within the scope of the concepts disclosed herein and the claims that follow.

What is claimed is:

1. An isolation network for a multi-way power divider/combiner, the isolation network comprising:
    a substrate;
    a plurality of isolation channels, each comprising:
        a common side port disposed on the substrate;
        a split side port disposed on the substrate; and
        an airbridge coupled between the common side port and the split side port and suspended over the substrate;
    a plurality of isolation resistors, each being disposed on the substrate below a respective airbridge and having a first end coupled to a respective isolation channel of the plurality of isolation channels; and
    a common resistor bus coupled to a second end of each of the plurality of isolation resistors.

2. The isolation network of claim 1, wherein the multi-way power divider/combiner is a planar integrated circuit.

3. The isolation network of claim 2, wherein the planar integrated circuit is a monolithic microwave integrated circuit (MMIC).

4. The isolation network of claim 1, wherein, for each of the plurality of isolation channels, the common side port is coupled to a corresponding impedance transformer of a plurality of impedance transformers of the multi-way power divider/combiner.

5. The isolation network of claim 4, wherein each of the plurality of impedance transformers comprises a quarter wave transformer.

6. The isolation network of claim 4, wherein the each of the plurality of impedance transformers comprises a transmission line.

7. The isolation network of claim 6, further comprising a common side conductor connecting the plurality of impedance transformers together at an opposite end from the plurality of isolation channels.

8. The isolation network of claim 1, wherein the first end of each of the plurality of isolation resistors is coupled to the common side port of the respective isolation channel.

9. The isolation network of claim 1, wherein the first end of each of the plurality of isolation resistors is in direct contact with the common side port of the respective isolation channel.

10. The isolation network of claim 1, wherein the first end of each of the plurality of isolation resistors is in direct contact with the split side port of the respective isolation channel.

11. The isolation network of claim 1, wherein the first end of each of the plurality of isolation resistors is connected to the airbridge of the respective isolation channel.

12. The isolation network of claim 1, wherein the common side port, the split side port, and the airbridge of each of the plurality of isolation channels is separated from the common side port, the split side port, and the airbridge of an adjacent isolation channel of the plurality of isolation channels.

13. The isolation network of claim 1, wherein each of the plurality of isolation channels is positioned adjacent and parallel to another isolation channel of the plurality of isolation channels.

14. The isolation network of claim 1, wherein the plurality of isolation channels is an even number of isolation channels.

15. The isolation network of claim 1, wherein the plurality of isolation channels is an odd number of isolation channels.

16. The isolation network of claim 1, wherein the plurality of isolation channels comprises three or more isolation channels.

17. The isolation network of claim 1, wherein the plurality of isolation channels comprises five or more isolation channels.

18. The isolation network of claim 17, wherein the isolation network provides greater than 20 decibels (dB) of isolation between 7 gigahertz (GHz) and 15 GHz across each of the plurality of isolation channels.

19. The isolation network of claim 18, wherein the isolation network provides greater than 24 dB of isolation between 8 GHz and 14 GHz across each of the plurality of isolation channels.

20. The isolation network of claim 18, wherein the isolation network provides 0.25 dB or less of insertion loss between 8 GHz and 14 GHz.

* * * * *